United States Patent
Kang et al.

(10) Patent No.: US 7,342,424 B2
(45) Date of Patent: Mar. 11, 2008

(54) DATA INPUT BUFFER IN SEMICONDUCTOR DEVICE

(75) Inventors: Hee-Bok Kang, Ichon-shi (KR); Jin-Hong Ahn, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 34 days.

(21) Appl. No.: 11/318,550

(22) Filed: Dec. 28, 2005

(65) Prior Publication Data

US 2006/0220702 A1 Oct. 5, 2006

(30) Foreign Application Priority Data

Mar. 31, 2005 (KR) .................. 10-2005-0027408

(51) Int. Cl.
 *H03K 3/00* (2006.01)
(52) U.S. Cl. ............... 327/108; 327/112; 327/544
(58) Field of Classification Search ............... 327/108, 327/112, 544
See application file for complete search history.

(56) References Cited

U.S. PATENT DOCUMENTS 5,614,847 A * 3/1997 Kawahara et al. ............ 326/98
5,656,946 A * 8/1997 Sim ............................. 326/21
6,597,625 B2 7/2003 Suzuki et al.

FOREIGN PATENT DOCUMENTS

| JP | 03-201117 | 9/1991 |
|---|---|---|
| JP | 2000-138575 | 5/2000 |
| JP | 2003-347860 | 12/2003 |
| JP | 2004-071145 | 3/2004 |
| KR | 1998-082677 | 12/1998 |
| KR | 100255519 B1 | 2/2000 |

OTHER PUBLICATIONS

Korean Office Action issued in corresponding Korean Patent Application No. 10-2005-0027408, Dated Jun. 30, 2006.

* cited by examiner

*Primary Examiner*—Kenneth B. Wells
(74) *Attorney, Agent, or Firm*—McDermott Will & Emery LLP

(57) ABSTRACT

A semiconductor device for improving an operation speed of a data input buffer includes: a plurality of data input buffers each for detecting a logic level of an input data by comparing the input data with a reference voltage to output the detected signal as an internal data signal; and a base voltage driving unit for driving a base power supply terminal of each data input buffer with one of a ground voltage and a negative boosted voltage according to an operation mode.

11 Claims, 6 Drawing Sheets

DATA INPUT BUFFER IN SEMICONDUCTOR DEVICE

FIELD OF THE INVENTION

The present invention relates to a semiconductor design technology; and, more particularly, to a data input buffer for use in a semiconductor device.

DESCRIPTION OF RELATED ARTS

A semiconductor device is manufactured based on a silicon wafer processing technology and a logic design technology. The end product of a semiconductor manufacturing process is a chip formed as a plastic package having different logic and function according to the use of the chip. A semiconductor chip is generally installed on a printed circuit board (PCB) and is provided with an operational power supply voltage. A semiconductor device, e.g., a semiconductor memory device, is operated according to an input/output of various signals. That is, based on combinations of input signals, an operation of the semiconductor device is performed and a result is outputted as an output signal. Meanwhile, the output signal of the semiconductor device can be used as an input signal of another semiconductor device included in a same system.

An input buffer is employed for inputting an input signal to a semiconductor device by buffering the input signal. A simple type of the input buffer is a static input buffer. The static input buffer is formed by connecting a p-type metal oxide semiconductor (PMOS) transistor with an n-type metal oxide semiconductor (NMOS) transistor in series between a power supply voltage and a ground voltage having an operation of an inverter.

Although the static input buffer has a simple structure, the static input buffer requires an input signal to have a relatively long signal swing between a logic high level and a logic low level since the static input buffer is easily influenced by a noise. Therefore, the static input buffer is not suitable for an input signal having a short signal swing or a high-frequency system.

Therefore, for overcoming the above-mentioned problem of the static input buffer, a differential amplifier input buffer has been developed. The differential amplifier input buffer is usually called a dynamic input buffer.

FIG. 1 is a block diagram showing a conventional differential amplifier input buffer array for use in a semiconductor device.

As shown, the semiconductor device includes a plurality of input buffers each of which corresponds to each data input pin. Herein, it is assumed that the number of the input buffers is n. Each input buffer receives a reference voltage VREF and one of input data, i.e., one of IN1, IN2, . . . and INn, as differential inputs and receives a clock enable signal CKE as an enable signal. Further, each input buffer receives a power supply voltage VDD and a ground voltage VSS as an excitation voltage and a base voltage respectively.

Herein, the reference voltage VREF has a constant voltage level of about VDD/2. The reference voltage VREF can be generated outside of the semiconductor device to be supplied to the plurality of input buffers through a particular input pin, or the semiconductor device can generate the reference voltage VREF itself.

FIG. 2 is a schematic circuit diagram showing each input buffer shown in FIG. 1.

As shown, the input buffer includes a detection unit 10 for detecting a logic level of an input data IN by comparing a voltage level of the reference voltage VREF with a voltage level of the input data IN; and a buffering unit 15 for buffering an output signal of the detection unit 10.

In detail, the detection unit 10 includes first to fourth PMOS transistors Q1 to Q4, first to third NMOS transistors Q5 to Q7 and an inverter.

A gate of the first NMOS transistor Q5 receives the reference voltage VREF and a gate of the second NMOS transistor Q6 receives the input data IN.

The second PMOS transistor Q2 is connected between the power supply voltage VDD and the first NMOS transistor Q5 and the third PMOS transistor Q3 is connected between the power supply voltage VDD and the second NMOS transistor Q6. Gates of the second and the third PMOS transistors Q2 and Q3 are commonly coupled to a first node N1 forming a current mirror.

The inverter inverts a clock enable bar signal /CKE to generate the clock enable signal CKE. The third NMOS transistor Q7 is connected between sources of the first and the second NMOS transistors Q5 and Q6 and the ground voltage VSS. A gate of the third NMOS transistor Q7 receives the clock enable signal CKE.

The first PMOS transistor Q1 is connected between the power supply voltage VDD and the first node N1 and receives the clock enable signal CKE through a gate of the first PMOS transistor Q1. The fourth PMOS transistor Q4 is connected between the power supply voltage VDD and an output node N2 and receives the clock enable signal CKE through a gate of the fourth PMOS transistor Q4.

Meanwhile, the buffering unit 15 includes odd numbers of inverters connected in series for receiving an output signal of the detection unit 10 in order to generate an internal data signal BIN.

If the input data IN is inputted to the second NMOS transistor Q6 having a high voltage, the detection unit 10 detects that a voltage level of the input data IN is higher than that of the reference voltage VREF. Then, the detection unit 10 is operated according to the detection result.

That is, the first NMOS transistor Q5 receiving the reference voltage VREF has a constant current, i.e., a first current i1 flown on the first NMOS transistor Q5. A second current i2 flown on the second NMOS transistor Q6 is varied according to a voltage level of the input data IN. The detection unit 10 determines a voltage level of the output node N2 based on a result of comparing the first current i1 with the second current i2.

When the clock enable bar signal /CKE is activated as a logic low level, the third NMOS transistor Q7 is turned on and the first and the fourth PMOS transistors Q1 and Q4 are turned off. Thus, the detection unit 10 is normally operated.

Meanwhile, when the clock enable bar signal /CKE is inactivated as a logic high level, the third NMOS transistor Q7 is turned off and, thus, the detection unit 10 is disabled. Further, the first and the fourth PMOS transistors Q1 and Q4 are turned off precharging the first node N1 and the output node N2 as a logic high level respectively. Therefore, even though the input data IN is changed, a current flow through a data input buffer can be prevented and a power consumption can be reduced at a standby mode.

Recently, the importance of a data input buffer has been emphasized in connection with a signal integrity as an operational voltage of a semiconductor device has been decreased and an operational speed of the semiconductor device has been increased.

FIG. 3 is a wave diagram showing the reference voltage VREF and a data signal.

Generally, for a high-speed data transmission, a data signal swing width from a high level to a low level is required to be short. Also, due to the shortened data signal swing width, power consumption for a data transmission can be reduced. That is, since a power consumption reduction due to the shortened data signal follows a square function while a power consumption increase due to a higher frequency follows a linear function, a power consumption can be reduced.

As shown in FIG. 3, the data signal swing width has been decreased from 500 mV to 200 mV and the reference voltage VREF has been decreased from 1.2V to 0.5V due to a higher operational speed and a lower operational voltage.

Meanwhile, a delay time at a data input buffer is increased as the data signal swing width is decreased. However, because the reference voltage VREF and the data signal swing width are not adjustable, the solution of the above-mentioned delay time problem has not been provided yet. The above-mentioned delay time problem may be more serious when the higher operational speed is more increased and the lower operational voltage is more decreased.

SUMMARY OF THE INVENTION

It is, therefore, an object of the present invention to provide a data input buffer and a semiconductor device including the data input buffer for reducing a delay time at a higher operational speed and a lower operational voltage.

In accordance with an aspect of the present invention, there is provided a semiconductor device for improving an operation speed of a data input buffer, including: a plurality of data input buffers each for detecting a logic level of an input data by comparing the input data with a reference voltage to output the detected signal as an internal data signal; and a base voltage driving unit for driving a base power supply terminal of each data input buffer with one of a ground voltage and a negative boosted voltage according to an operation mode.

In accordance with another aspect of the present invention, there is provided a data input buffer for use in a semiconductor device for improving an operation speed of the data input buffer, including: a detection unit for detecting a logic level of an input data by comparing the input data with a reference voltage; a base voltage driving unit for driving a base power supply terminal of the detection unit with a negative boosted voltage at an activation mode and for driving the base power supply terminal with a ground voltage at an inactivation mode; a level shifting unit for shifting a swing level of an output of the detection unit to a swing level between a power supply voltage and the ground voltage at the activation mode; and a buffering unit for buffering an output of the level shifting unit.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a data input buffer for use in a semiconductor device in accordance with the present invention will be described in detail referring to the accompanying drawings.

Figure 1:
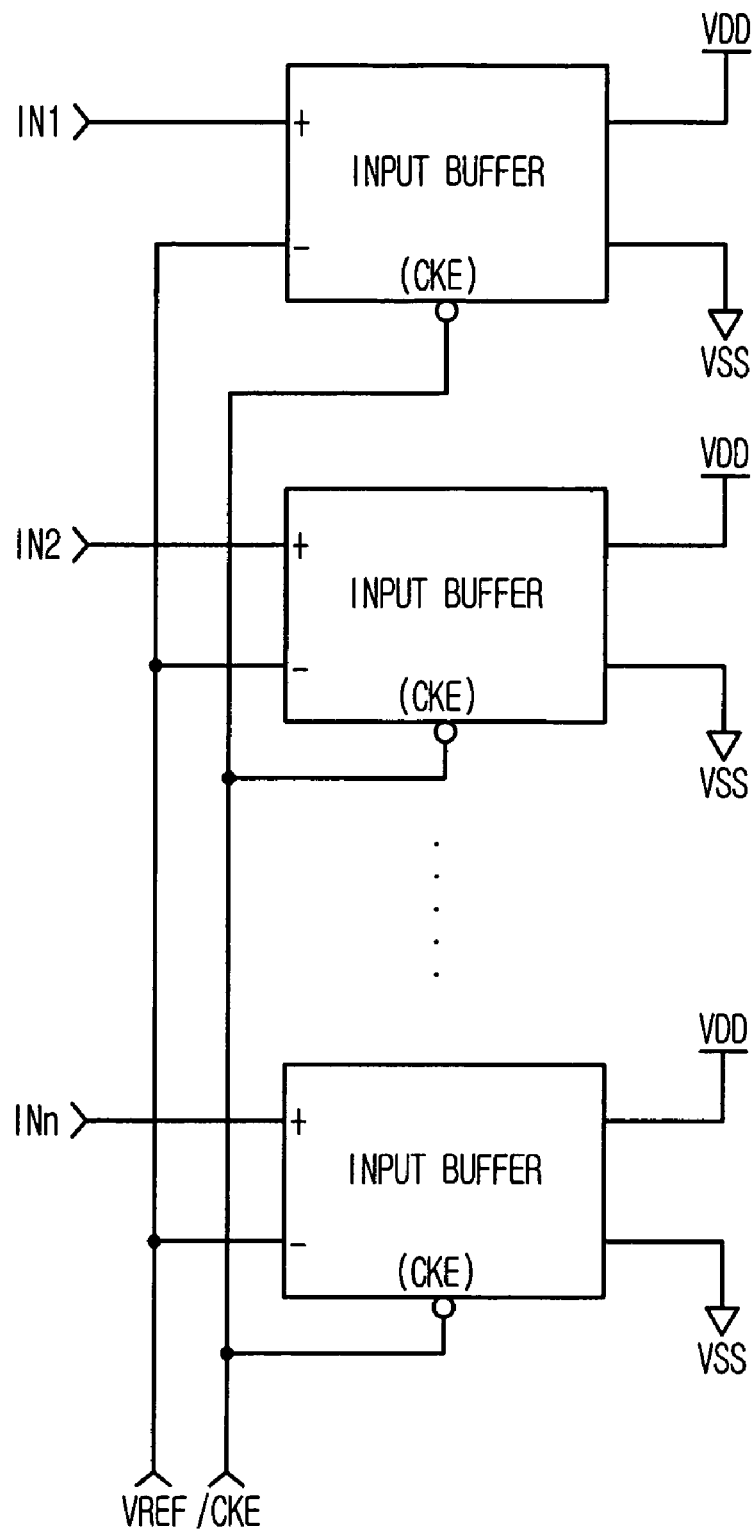
FIG. 1 is a block diagram showing a conventional differential amplifier input buffer array for use in a semiconductor device.
Figure 2:
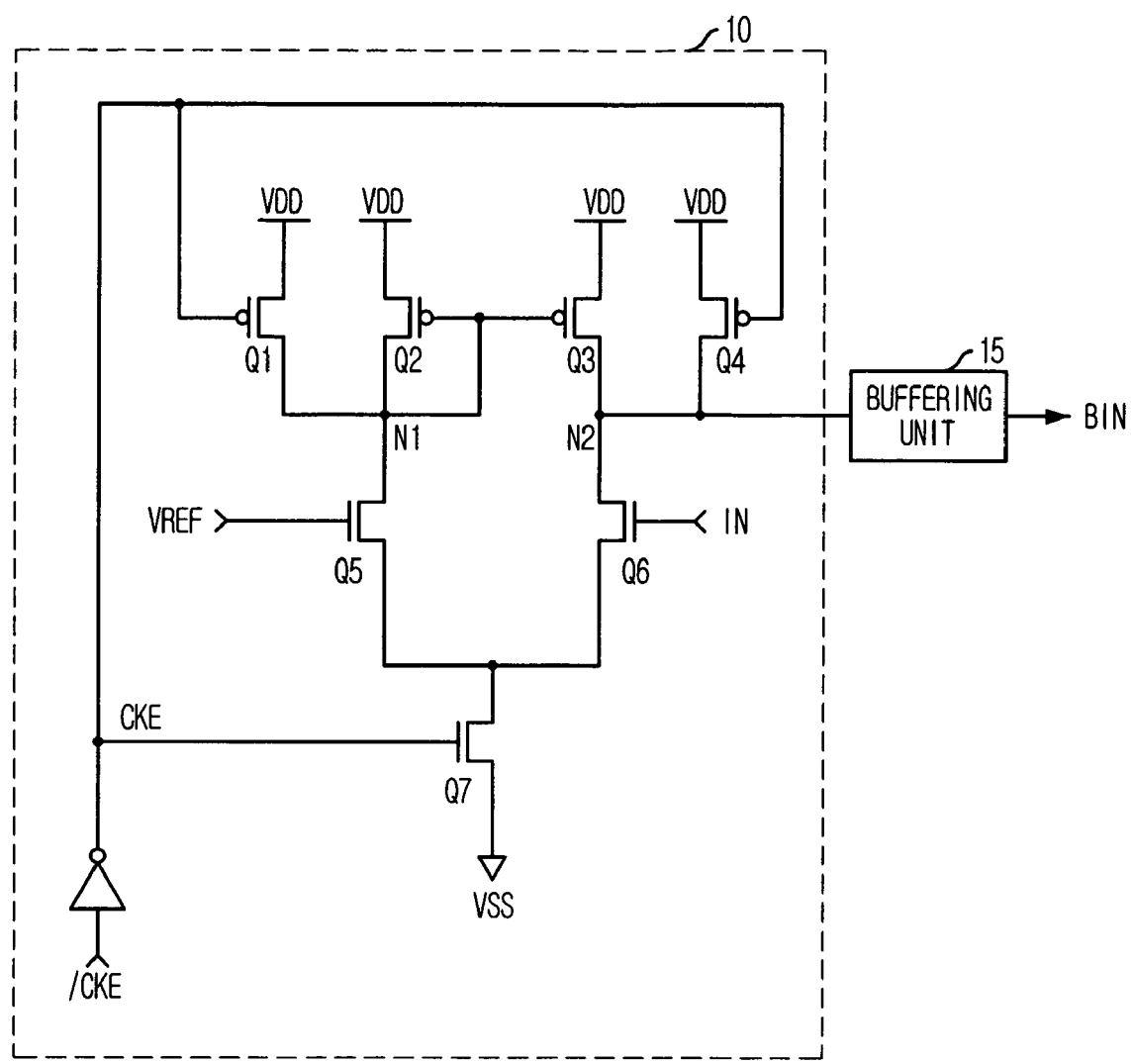
FIG. 2 is a schematic circuit diagram showing each input buffer shown in FIG. 1.
Figure 3:
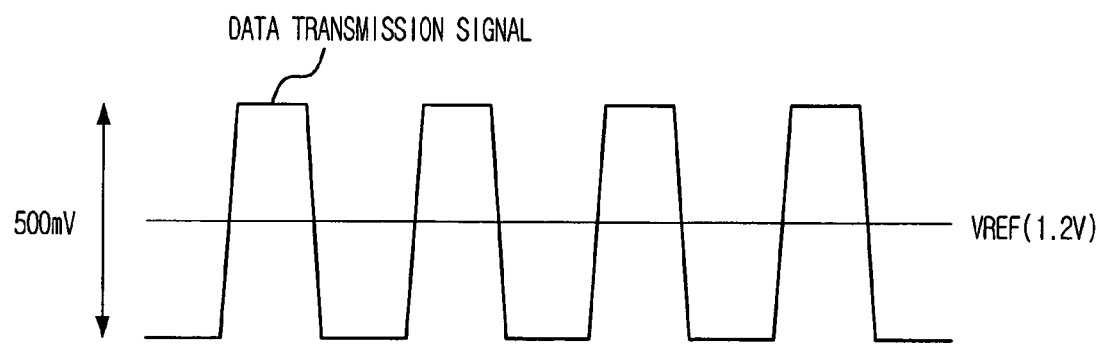
FIG. 3 is a wave diagram showing a reference voltage and a data signal.
Figure 3:
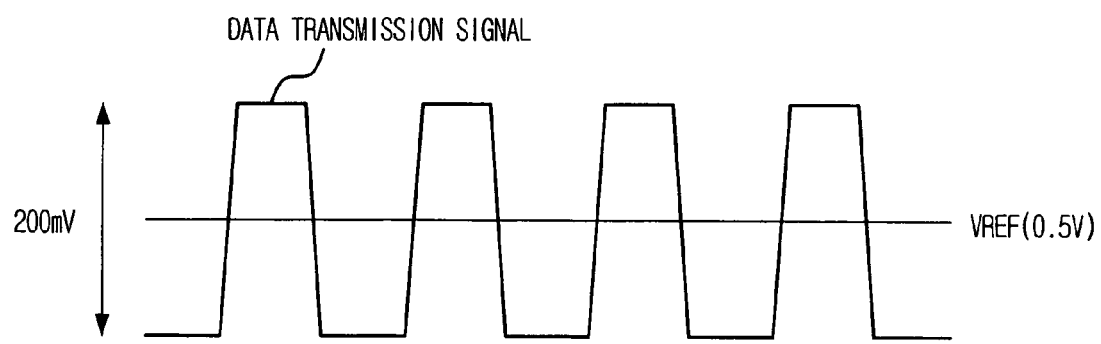
Figure 4:
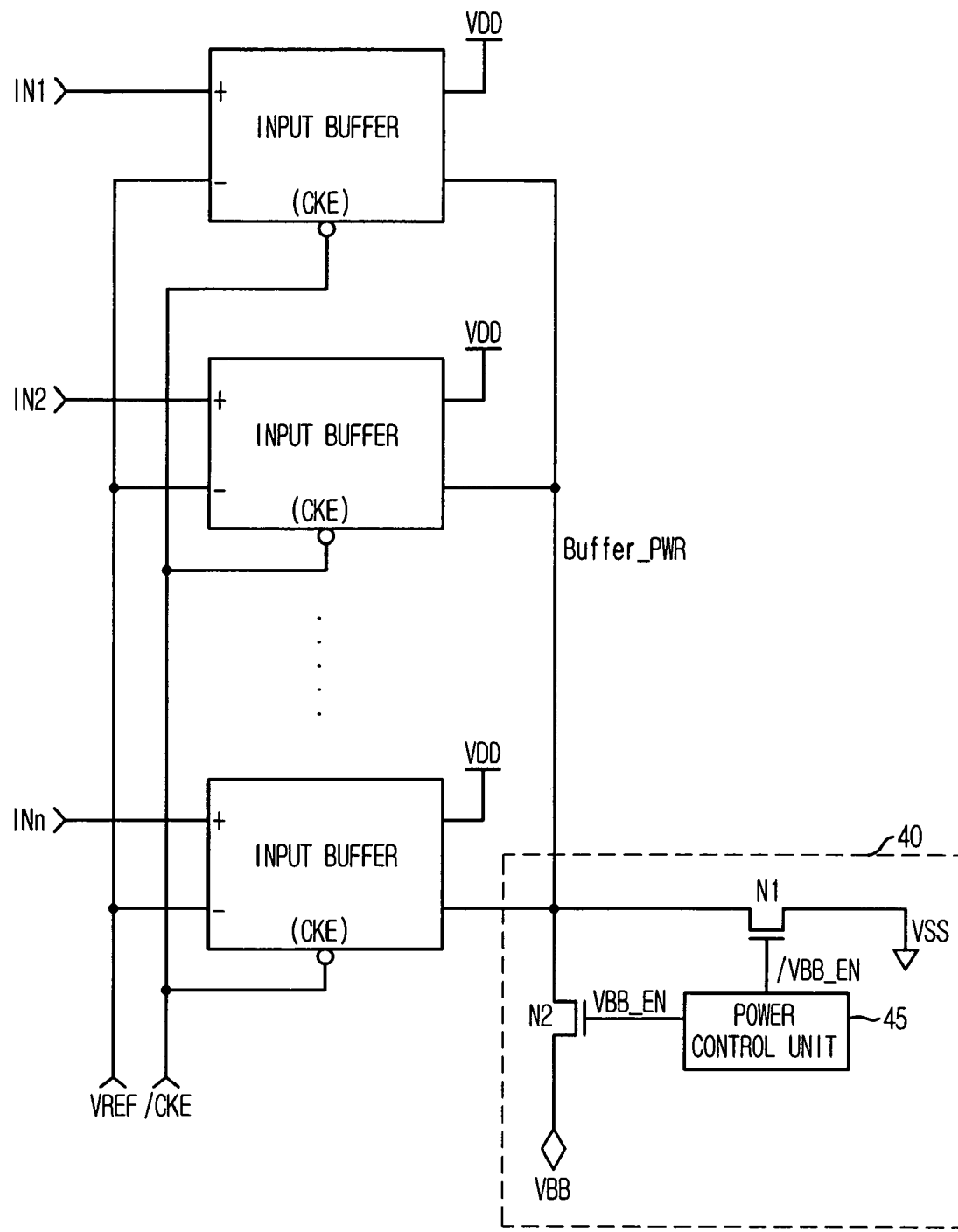
FIG. 4 is a block diagram showing a data input buffer array in accordance with a preferred embodiment of the present invention.

FIG. 4 is a block diagram showing a data input buffer array in accordance with a preferred embodiment of the present invention.

As shown, the data input buffer array includes a plurality of data input buffers and a base voltage driving unit 40.

Each data input buffer receives a reference voltage VREF and one of input data, i.e., one of IN1, IN2, ... and INn, as differential inputs and receives a clock enable signal CKE as an enable signal. Further, each data input buffer receives a power supply voltage VDD as an excitation voltage. Also, each data input buffer receives a ground voltage VSS or a back bias voltage VBB as a base voltage. The base voltage driving unit 40 drives a base power supply terminal Buffer_PWR of each data input buffer by the ground voltage VSS or the back bias voltage VBB according to an operation mode.

The base voltage driving unit 40 includes a power control unit 45, a first n-type metal oxide semiconductor (NMOS) transistor N1 and a second NMOS transistor N2.

The power control unit 45 generates a back bias voltage enable signal VBB_EN and its inverted signal, i.e., a back bias voltage enable bar signal /VBB_EN according to the operation mode. The second NMOS transistor N2 is connected between the base power supply terminal Buffer_PWR and the back bias voltage VBB and a gate of the second NMOS transistor N2 receives the back bias voltage enable signal VBB_EN. Similarly, the first NMOS transistor N1 is connected between the base power supply terminal Buffer_PWR and the ground voltage VSS and a gate of the first NMOS transistor N1 receives the back bias voltage enable bar signal /VBB_EN.

Herein, the reference voltage VREF has a constant voltage level of about VDD/2. The reference voltage VREF can be generated outside of the semiconductor device to be supplied to the plurality of input buffers through a particular input pin, or the semiconductor device can generate the reference voltage VREF itself.

Figure 5:
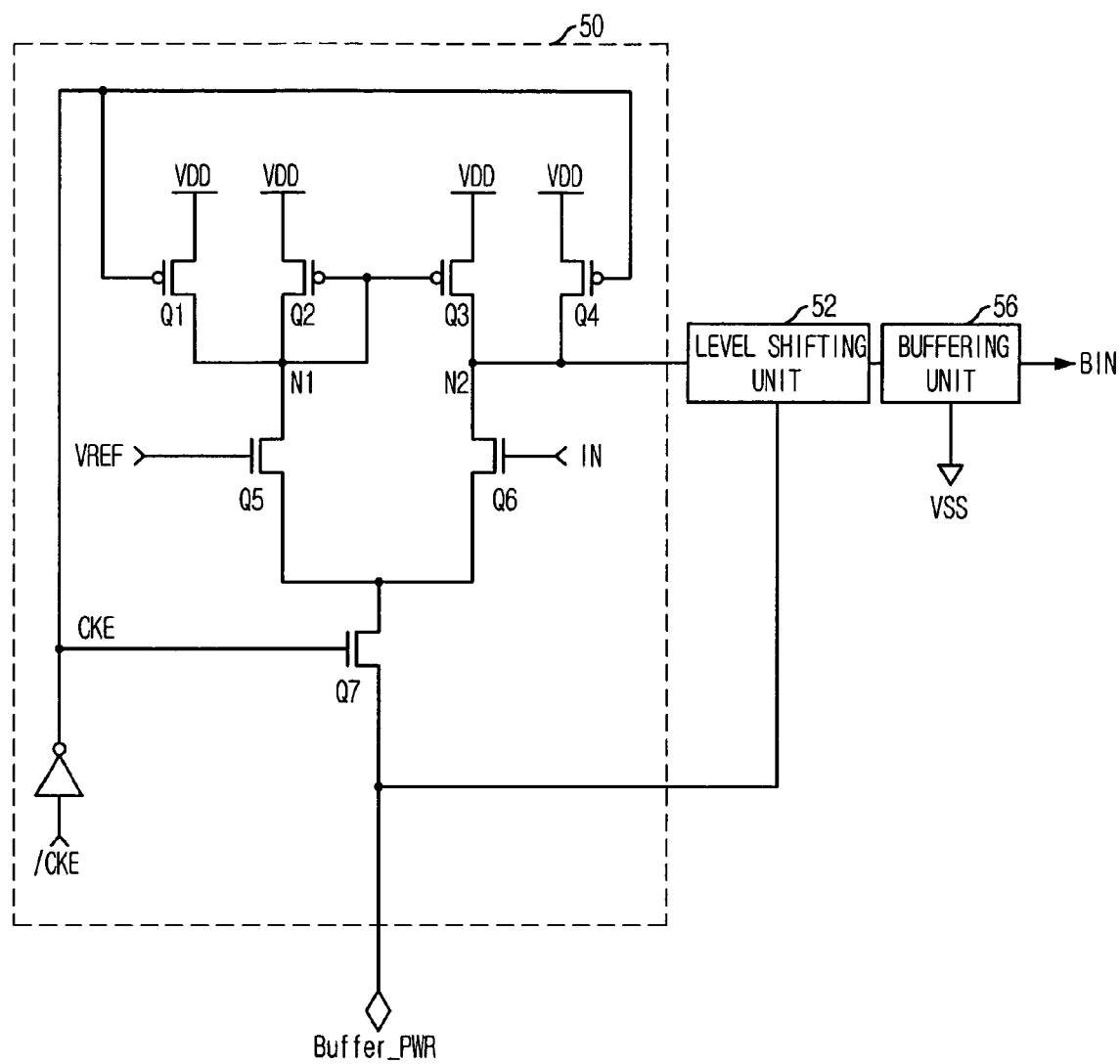
FIG. 5 is a schematic circuit diagram showing each data input buffer shown in FIG. 4.

FIG. 5 is a schematic circuit diagram showing each data input buffer shown in FIG. 4.

As shown, the data input buffer includes a detection unit 50 for detecting a logic level of an input data IN by comparing a voltage level of the reference voltage VREF with a voltage level of the input data IN; a level shifting unit 52 for shifting a swing level of an output of the detection unit 50 to a swing level between the power supply voltage VDD and the ground voltage VSS; and a buffering unit 56 for buffering an output signal of the level shifting unit 52.

In detail, the detection unit 50 includes a first and a second input NMOS transistors Q5 and Q6, a first and a second load p-type metal oxide semiconductor (PMOS) transistors Q2 and Q3, a bias NMOS transistor Q7, a first and a second PMOS transistors Q1 and Q4 and an inverter.

A gate of the first input NMOS transistor Q5 receives the reference voltage VREF and a gate of the second input NMOS transistor Q6 receives the input data IN.

The first load PMOS transistor Q2 is connected between the power supply voltage VDD and the first input NMOS transistor Q5 and the second load PMOS transistor Q3 is connected between the power supply voltage VDD and the second input NMOS transistor Q6. Gates of the first and the second load PMOS transistors Q2 and Q3 are commonly coupled to a first node N1 forming a current mirror.

The inverter inverts a clock enable bar signal /CKE to generate the clock enable signal CKE. The bias NMOS transistor Q7 is connected between sources of the first and the second input NMOS transistors Q5 and Q6 and the base power supply terminal Buffer_PWR. A gate of the bias NMOS transistor Q7 receives the clock enable signal CKE.

The first PMOS transistor Q1 is connected between the power supply voltage VDD and the first node N1 and receives the clock enable signal CKE through a gate of the first PMOS transistor Q1. The second PMOS transistor Q4 is connected between the power supply voltage VDD and an output node N2 and receives the clock enable signal CKE through a gate of the second PMOS transistor Q4.

Meanwhile, the buffering unit 56 includes odd numbers of inverters connected in series for receiving an output signal of the level shifting unit 52 in order to generate an internal data signal BIN.

The level shifting unit 52 can be embodied with a general level shifter circuit. A power supply of the level shifting unit 52 and the detection unit 50 is controlled by the base power supply terminal Buffer_PWR. Herein, the level shifting unit 52 is employed for preventing a serious abnormal operation due to an input of a low level input data not having a voltage level of the ground voltage VSS but having a voltage level of the back bias voltage VBB.

Figure 6:
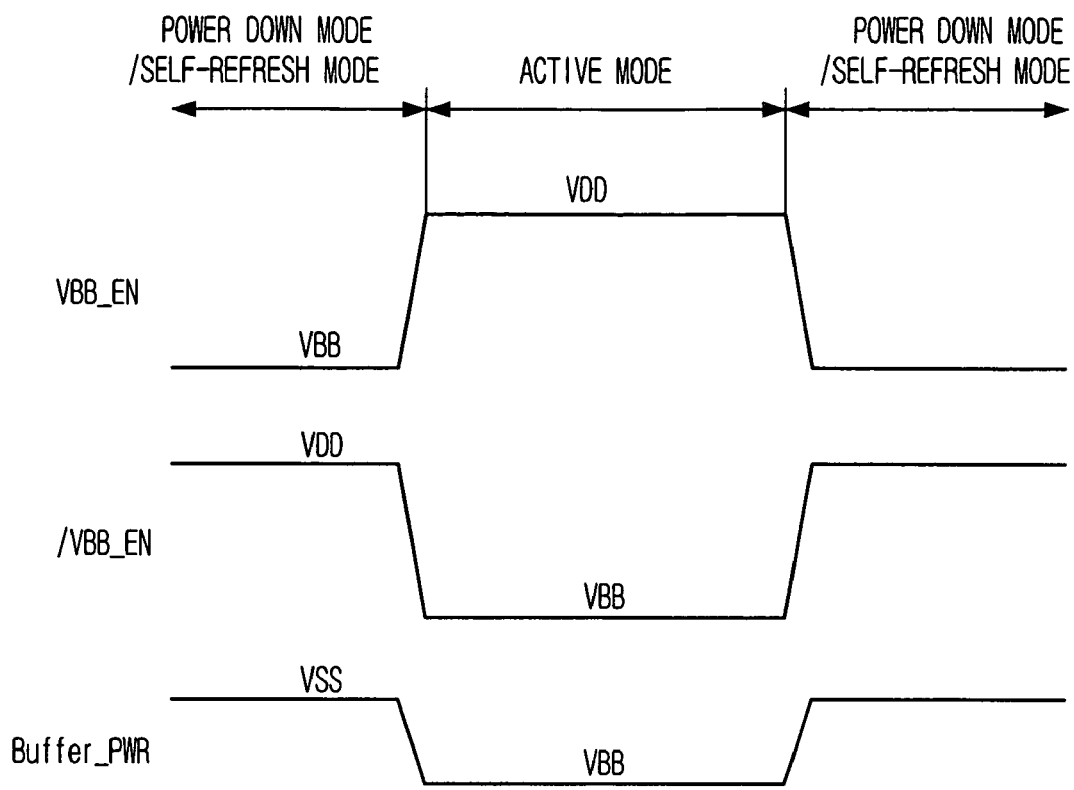
FIG. 6 is a timing diagram showing an operation of the base voltage driving unit shown in FIG. 4.

FIG. 6 is a timing diagram showing an operation of the base voltage driving unit 40 shown in FIG. 4.

Referring to FIGS. 4 to 6, an operation of the data input buffer shown in FIG. 5 is described below.

If the input data IN is inputted to the second input NMOS transistor Q6 having a high voltage, the detection unit 50 detects that a voltage level of the input data IN is higher than that of the reference voltage VREF. Then, the detection unit 50 is operated according to the detection result.

That is, the first input NMOS transistor Q5 receiving the reference voltage VREF has a constant current, i.e., a first current i1 flown on the first input NMOS transistor Q5. A second current i2 flown on the second input NMOS transistor Q6 is varied according to a voltage level of the input data IN. The detection unit 50 determines a voltage level of the output node N2 based on a result of comparing the first current i1 with the second current i2.

When the clock enable bar signal /CKE is activated as a logic low level, the bias NMOS transistor Q7 is turned on and the first and the fourth PMOS transistors Q1 and Q4 are turned off. Thus, the detection unit 50 is normally operated.

Meanwhile, when the clock enable bar signal /CKE is inactivated as a logic high level, the bias NMOS transistor Q7 is turned off and, thus, the detection unit 50 is disabled. Further, the first and the fourth PMOS transistors Q1 and Q4 are turned off precharging the first node N1 and the output node N2 as a logic high level respectively. Therefore, even though the input data IN is changed, a current flow through a data input buffer can be prevented and a power consumption can be reduced at a standby mode.

The above-mentioned operation of the data input buffer in accordance with the present invention is similar to that of the conventional data input buffer. However, in accordance with the present invention, the base power supply terminal Buffer_PWR is driven by the ground voltage VSS or the back bias voltage VBB based on the operation mode.

That is, when a chip is in an inactivation mode such as a power-down mode or a self-refresh mode, the back bias voltage enable bar signal /VBB_EN is in a logic high level, and, thus, the first NMOS transistor N1 is turned on and the second NMOS transistor N2 is turned off. Accordingly, the base power supply terminal Buffer_PWR is driven by the ground voltage VSS. In this case, since the data input buffer receives the power supply voltage VDD and the ground voltage VSS as a driving voltage, an operation of the data input buffer is same to that of the conventional data input buffer and the level shifting unit 52 does not performs a level shifting operation.

On the contrary, when the chip is in an active mode, the back bias voltage enable signal VBB_EN is in a logic high level and, thus, the first NMOS transistor N1 is turned off and the second NMOS transistor N2 is turned on. Therefore, the base power supply terminal Buffer_PWR is driven by the back bias voltage VBB. In this case, since the data input buffer receives the power supply voltage VDD and the back bias voltage VBB as a driving voltage, an operational speed of the detection unit 50 is increased in comparison with the conventional data input buffer. Accordingly, an output of the detection unit 50 swings between VDD-VBB level and, thus, the level shifting unit 52 shifts a swing level of the output of the detection unit 50 to VDD-VSS level in order to prevent the abnormal operation in the buffering unit 56.

As above-mentioned, when the chip is activated, the operational speed of the data input buffer is increased by using the back bias voltage VBB as the base voltage. Also, when the chip is inactivated, a standby current increase caused by the back bias voltage VBB is prevented by using the ground voltage VSS as the base voltage.

Therefore, in accordance with the present invention, an operational speed of a data input buffer can be improved in a lower operational voltage/higher operational speed system and, thus, a semiconductor device can be more stably operated.

Meanwhile, although the detection unit 50 is embodied with an NMOS-type differential amplifier where a current mirror is coupled to an excitation voltage terminal and a bias transistor is coupled to a base voltage terminal, the detection unit 50 can be embodied with a PMOS-type differential amplifier where the current mirror is coupled to the base voltage terminal and the bias transistor is coupled to the excitation voltage terminal.

Further, although the back bias voltage VBB is used as a negative boosted voltage, a negative boosted voltage circuit can be provided for generating a negative boosted voltage to thereby use the negative boosted voltage instead of the back bias voltage.

Furthermore, the back bias voltage enable signal VBB_EN and the back bias voltage enable bar signal /VBB_EN can be replaced with other signals representing the operation mode. Also, the clock enable signal CKE used as a buffer enable signal can be replaced with another signal.

The present application contains subject matter related to Korean patent application No. 2005-27408, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor device for improving an operation speed of a data input buffer, comprising:
    a plurality of data input buffers each for detecting a logic level of an input data by comparing the input data with a reference voltage to output the detected signal as an internal data signal; and
    a base voltage driving unit for driving a base power supply terminal of each data input buffer with one of a ground voltage and a negative boosted voltage according to an operation mode, wherein the negative boosted voltage is a back bias voltage; and
    a level shifter for shifting a swing level of an output of the base voltage driving unit to a swing level between a power supply voltage and the ground voltage when the base power supply terminal is driven with the negative boosted voltage.

2. The semiconductor device as recited in claim 1, wherein the base voltage driving unit includes: a power control unit for generating a base power supply control signal according to the operation mode; a first driver for driving the base power supply terminal with the negative boosted voltage in response to the base power supply control signal; and a second driver for driving the base power supply terminal with the ground voltage in response to an inverted signal of the base power supply control signal.

3. The semiconductor device as recited in claim 2, wherein the first driver includes a first n-type metal oxide semiconductor (NMOS) transistor connected between the back bias voltage and the base power supply terminal, wherein a gate of the first NMOS transistor receives the base power supply control signal.

4. The semiconductor device as recited in claim 3, wherein the second driver includes a second NMOS transistor connected between the ground voltage and the base power supply terminal, wherein a gate of the second NMOS transistor receives the inverted signal of the base power supply control signal.

5. The semiconductor device as recited in claim 2, wherein the base voltage driving unit drives the base power supply terminal with the ground voltage when the semiconductor device is operated in an activation mode such as a power-down mode or a self-refresh mode and with the back bias voltage when the semiconductor device is operated in an active mode.

6. A data input buffer for use in a semiconductor device for improving an operation speed of the data input buffer, comprising: a detection unit for detecting a logic level of an input data by comparing the input data with a reference voltage; a base voltage driving unit for driving a base power supply terminal of the detection unit with a negative boosted voltage at an activation mode and for driving the base power supply terminal with a ground voltage at an inactivation mode; a level shifting unit for shifting a swing level of an output of the detection unit to a swing level between a power supply voltage and the ground voltage at the activation mode; and a buffering unit for buffering an output of the level shifting unit.

7. The data input buffer as recited in claim 6, wherein the base voltage driving unit includes: a power control unit for generating a base power supply control signal according to the activation mode and the inactivation mode; a first driver for driving the base power supply terminal with the negative boosted voltage in response to the base power supply control signal; and a second driver for driving the base power supply terminal with the ground voltage in response to an inverted signal of the base power supply control signal.

8. The data input buffer as recited in claim 7, wherein the negative boosted voltage is a back bias voltage.

9. The data input buffer as recited in claim 8, wherein first driver includes a first NMOS transistor connected between the back bias voltage and the base power supply terminal, wherein a gate of the first NMOS transistor receives the base power supply control signal.

10. The data input buffer as recited in claim 9, wherein the second driver includes a second NMOS transistor connected between the ground voltage and the base power supply terminal, wherein a gate of the second NMOS transistor receives the inverted signal of the base power supply control signal.

11. The data input buffer as recited in claim 6, wherein the detection unit includes: a reference voltage input unit for receiving the reference voltage; a data input unit for receiving the input data; a current mirror coupled to the reference voltage input unit and the data input unit; and a bias unit coupled to the base power supply terminal for providing a first current path through the reference voltage input unit and a second current path through the data input unit.

* * * * *